United States Patent
Baselmans

(10) Patent No.: US 11,467,507 B2
(45) Date of Patent: Oct. 11, 2022

(54) RADIATION SYSTEM

(71) Applicant: ASML Netherlands B.V., Veldhoven (NL)

(72) Inventor: Johannes Jacobus Matheus Baselmans, Oirschot (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/277,554

(22) PCT Filed: Aug. 28, 2019

(86) PCT No.: PCT/EP2019/072983
§ 371 (c)(1),
(2) Date: Mar. 18, 2021

(87) PCT Pub. No.: WO2020/057924
PCT Pub. Date: Mar. 26, 2020

(65) Prior Publication Data
US 2021/0356871 A1    Nov. 18, 2021

(30) Foreign Application Priority Data
Sep. 21, 2018 (EP) .................................. 18195886

(51) Int. Cl.
*G03F 7/20* (2006.01)
*G03F 9/00* (2006.01)
(Continued)

(52) U.S. Cl.
CPC ......... *G03F 7/7085* (2013.01); *G02B 27/141* (2013.01); *G02B 27/283* (2013.01);
(Continued)

(58) Field of Classification Search
CPC ... G03F 7/7085; G03F 7/70483–70575; G03F 7/70608–70683; G03F 9/7065;
(Continued)

(56) References Cited

U.S. PATENT DOCUMENTS 4,349,277 A * 9/1982 Mundy .............. G01B 11/2509
250/237 G
6,453,000 B1 9/2002 Terashima et al.
(Continued)

FOREIGN PATENT DOCUMENTS

CN 101286010 A * 10/2008
CN 203786295 U 8/2014
(Continued)

OTHER PUBLICATIONS

International Search Report and Written Opinion of the International Searching Authority directed to related International Patent Application No. PCT/EP2019/072983, dated Dec. 4, 2019; 11 pages.
(Continued)

*Primary Examiner* — Christina A Riddle
(74) *Attorney, Agent, or Firm* — Sterne, Kessler, Goldstein & Fox P.L.L.C.

(57) ABSTRACT

A radiation system comprising a radiation source and a radiation conditioning apparatus, wherein the radiation source is configured to provide a radiation beam with wavelengths which extend from ultraviolet to infrared, and wherein the radiation conditioning apparatus is configured to separate the radiation beam into at least two beam portions and is further configured to condition the at least two beam portions differently.

15 Claims, 6 Drawing Sheets

(51) Int. Cl.
*G02B 27/14* (2006.01)
*G02B 27/28* (2006.01)

(52) U.S. Cl.
CPC ........ *G03F 7/70683* (2013.01); *G03F 9/7065* (2013.01); *G03F 9/7088* (2013.01)

(58) Field of Classification Search
CPC ....... G03F 9/7088; G03F 9/7023–7034; G02B 27/141; G02B 27/283
USPC ..... 355/30, 52–55, 67–71, 77; 356/600–640, 356/399–401
See application file for complete search history.

(56) References Cited

U.S. PATENT DOCUMENTS

| | | | |
|---|---|---|---|
| 6,952,253 | B2 | 10/2005 | Lof et al. |
| 6,961,116 | B2 | 11/2005 | Den Boef et al. |
| 7,649,676 | B2 | 1/2010 | Baselmans et al. |
| 8,164,740 | B2 | 4/2012 | Visser et al. |
| 8,760,622 | B2 | 6/2014 | Makinouchi |
| 10,642,164 | B2 | 5/2020 | Otani et al. |
| 11,092,903 | B2 | 8/2021 | Kanehara |
| 2005/0078292 | A1* | 4/2005 | Bruebach ............ G03F 7/70625 355/67 |
| 2006/0227069 | A1 | 10/2006 | Baselmans et al. |
| 2007/0058164 | A1* | 3/2007 | Shibata ............ G01N 21/95607 356/237.2 |
| 2007/0242253 | A1 | 10/2007 | Visser et al. |
| 2008/0204748 | A1* | 8/2008 | Nomaru ............... B23K 26/046 356/332 |
| 2009/0091734 | A1* | 4/2009 | Visser ................ G03F 7/70075 355/67 |
| 2015/0109624 | A1* | 4/2015 | Kreuzer ............. G03F 7/70108 356/508 |
| 2015/0227061 | A1 | 8/2015 | Tinnemans et al. |
| 2016/0252461 | A1 | 9/2016 | Balthasar et al. |
| 2017/0356800 | A1* | 12/2017 | Krishnan ............ G03F 7/70633 |
| 2018/0373171 | A1* | 12/2018 | Hugers ................ G01B 11/254 |

FOREIGN PATENT DOCUMENTS

| | | |
|---|---|---|
| JP | H06-42918 A | 2/1994 |
| JP | 2000-221138 A | 8/2000 |
| JP | 2000-357644 A | 12/2000 |
| JP | 2008-034813 A | 2/2008 |
| JP | 2009-229414 A | 10/2009 |
| JP | 2011-504782 A | 2/2011 |
| JP | 2018-054303 A | 4/2018 |
| JP | 2018-124557 A | 8/2018 |
| KR | 2016-0123184 | 10/2016 |
| WO | WO 2009/070160 A1 | 6/2009 |
| WO | WO 2009/075103 A1 | 4/2011 |
| WO | WO-2017012782 A1 * | 1/2017 ......... G03F 7/70091 |
| WO | WO 2017/060014 A1 | 4/2017 |
| WO | WO 2017/211694 A1 | 12/2017 |

OTHER PUBLICATIONS

International Preliminary Report on Patentability directed to related International Patent Application No. PCT/EP2019/072983, dated Mar. 23, 2021; 8 pages.

Huijbregtse et al., "Overlay Performance with Advanced ATH-ENA™ Alignment Strategies," Metrology, Inspection, and Process Control for Microlithography XVII, Proceedings of SPIE, vol. 5038, Jun. 2, 2003; pp. 918-928.

Research Disclosure No. 592052, Jul. 15, 2013; 5 pages.

* cited by examiner

RADIATION SYSTEM

CROSS-REFERENCE TO RELATED APPLICATIONS

This application claims priority of EP application 18195886.9 which was filed on 21 Sep. 2018 and which is incorporated herein in its entirety by reference.

FIELD

The present invention relates to a radiation system configured to provide radiation which may be used by different types of measurement system in a lithographic apparatus or lithographic tool.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation, which may be referred to as exposure radiation, determines the minimum size of features which are patterned on the substrate. Typical wavelengths of exposure radiation currently in use are 365 nm (i-line), 248 nm, 193 nm and 13.5 nm. A lithographic apparatus, which uses extreme ultraviolet (EUV) exposure radiation, having a wavelength within a range of 4 nm to 20 nm, for example 6.7 nm or 13.5 nm, may be used to form smaller features on a substrate than a lithographic apparatus which uses, for example, exposure radiation with a wavelength of 193 nm.

Before a pattern is projected from a patterning device onto a layer of radiation sensitive material provided on a substrate the topography of the substrate is measured. In order to achieve this, the lithographic apparatus is provided with a topography measurement system. The topography measurement system measures the height of the substrate across the surface of the substrate by directing radiation onto the substrate and measuring reflected radiation. The radiation may be referred to as measurement radiation. The height measurements are used to form a height map which assists accurate projection of a pattern onto the substrate.

In order to control the lithographic process to place device features accurately on the substrate, alignment marks are generally provided on the substrate, and the lithographic apparatus includes an alignment system by which positions of alignment marks on a substrate can be measured accurately. The alignment system directs radiation onto the substrate and measures reflected radiation. The radiation may be referred to as measurement radiation. The alignment systems are effectively position measuring apparatuses. Different types of alignment marks and alignment systems with different types of alignment sensors are known, e.g., are provided by different manufacturers.

The topography measurement system and the alignment system may be considered to be different types of measurement system. It may be complex and expensive to provide measurement radiation for use by different types of measurement system.

SUMMARY

It may be desirable to provide, for example, a topography measurement system which obviates or mitigates one or more of the problems of the prior art, whether identified herein or elsewhere.

According to a first aspect of the invention there is provided a radiation system comprising a radiation source and a radiation conditioning apparatus, wherein the radiation source is configured to provide a radiation beam with wavelengths which extend from ultraviolet to infrared, and wherein the radiation conditioning apparatus is configured to separate the radiation beam into at least two beam portions and is further configured to condition the at least two beam portions differently.

The radiation system advantageously provides two beam portions which have been conditioned in different ways and which can therefore be used for different applications. This may be simpler and/or more reliable than providing two separate radiation sources configured to provide radiation beams which have been conditioned in different ways.

The radiation conditioning apparatus may be configured to condition a first beam portion to provide conditioned radiation for use by a first type of measurement system, and to condition a second beam portion to provide conditioned radiation for use by a second type of measurement system.

The radiation conditioning apparatus may comprise a coherence removal apparatus configured to remove or reduce coherence from one or more of the beam portions.

The radiation conditioning apparatus may be configured to increase etendue of one or more of the beam portions.

The radiation conditioning apparatus may comprise a homogenizer configured to reduce non-uniformity of one or more of the beam portions.

The radiation conditioning apparatus may comprise a wavelength based beam separation apparatus configured to separate the radiation beam or a radiation beam portion into at least two beam portions based upon wavelength.

The wavelength based beam separation apparatus may be configured to provide three or more beam portions with different wavelengths.

The wavelength based beam separation apparatus may comprise at least one dichroic mirror.

The radiation conditioning apparatus may comprise a beam separating apparatus which is configured to intersect with part of the radiation beam or part of a radiation beam portion, such that that part is reflected by the beam separating apparatus but a remaining part of the radiation beam or radiation beam portion is not.

The radiation conditioning apparatus may comprise a beam separating apparatus which is configured to periodically intersect with and reflect part of the radiation beam or a radiation beam portion.

The radiation conditioning apparatus may comprise a polarizing beam splitter which is configured to reflect part of the radiation beam or a radiation beam portion having a first polarization, and is configured to transmit part of the radiation beam or a radiation beam portion having a second polarization.

The radiation conditioning apparatus may comprise an electro-optic element which is configured to separate the radiation beam or a radiation beam portion into at least two parts.

The radiation conditioning system may further comprise a plurality of waveplates configured to allow polarizations of the at least two beam portions to be rotated.

The first type of measurement system may comprise a topography measurement system, or a fuel droplet metrology system.

The second type of measurement system may comprise an alignment system, or a position measurement system, or a metrology system, or a reticle inspection system.

According to a second aspect of the invention there is provided a lithographic apparatus configured to transfer a pattern from a patterning device to a substrate, wherein the lithographic apparatus comprises a first type of measurement system and a second type of measurement system, and wherein the lithographic apparatus further comprises a radiation system comprising a radiation source and a radiation conditioning apparatus, wherein the radiation source is configured to provide a radiation beam with wavelengths which extend from ultraviolet to infrared, and wherein the radiation conditioning apparatus is configured to separate the radiation beam into a first beam portion and a second beam portion, condition the first beam portion to provide conditioned radiation which is provided to the first type of measurement system, and condition the second beam portion to provide conditioned radiation which is provided to the second type of measurement system.

Features of the first aspect of the invention may be combined with the second aspect of the invention.

According to a third aspect of the invention there is provided a lithographic tool configured to measure properties of a substrate, wherein the lithographic tool comprises a first type of measurement system and a second type of measurement system, and wherein the lithographic tool further comprises a radiation system comprising a radiation source and a radiation conditioning apparatus, wherein the radiation source is configured to provide a radiation beam with wavelengths which extend from ultraviolet to infrared, and wherein the radiation conditioning apparatus is configured to separate the radiation beam into a first beam portion and a second beam portion, condition the first beam portion to provide conditioned radiation which is provided to the first type of measurement system, and condition the second beam portion to provide conditioned radiation which is provided to the second type of measurement system.

Features of the first aspect of the invention may be combined with the third aspect of the invention.

According to a fourth aspect of the invention there is provide a method comprising providing a radiation beam with wavelengths which extend from ultraviolet to infrared separating the radiation beam into at least two beam portions, and conditioning the at least two beam portions differently.

A first beam portion may be conditioned for use by a first type of measurement system, and a second beam portion may be conditioned for use by a second type of measurement system.

Conditioning of a beam portion may comprise at least one of removing or reducing coherence, increasing etendue, reducing non-uniformity, wavelength-dependent selection.

The method of the fourth aspect of the invention may use features of the radiation system according to the first aspect of the invention.

BRIEF DESCRIPTION OF THE DRAWINGS

Embodiments of the invention will now be described, by way of example only, with reference to the accompanying schematic drawings, in which.

DETAILED DESCRIPTION

In the present document, the exposure radiation used by the lithographic apparatus may have any suitable wavelength, including ultraviolet radiation (for example with a wavelength of 365, 248, 193, 157 or 126 nm) and EUV (extreme ultra-violet radiation, for example, having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable RCD array.

Figure 1:
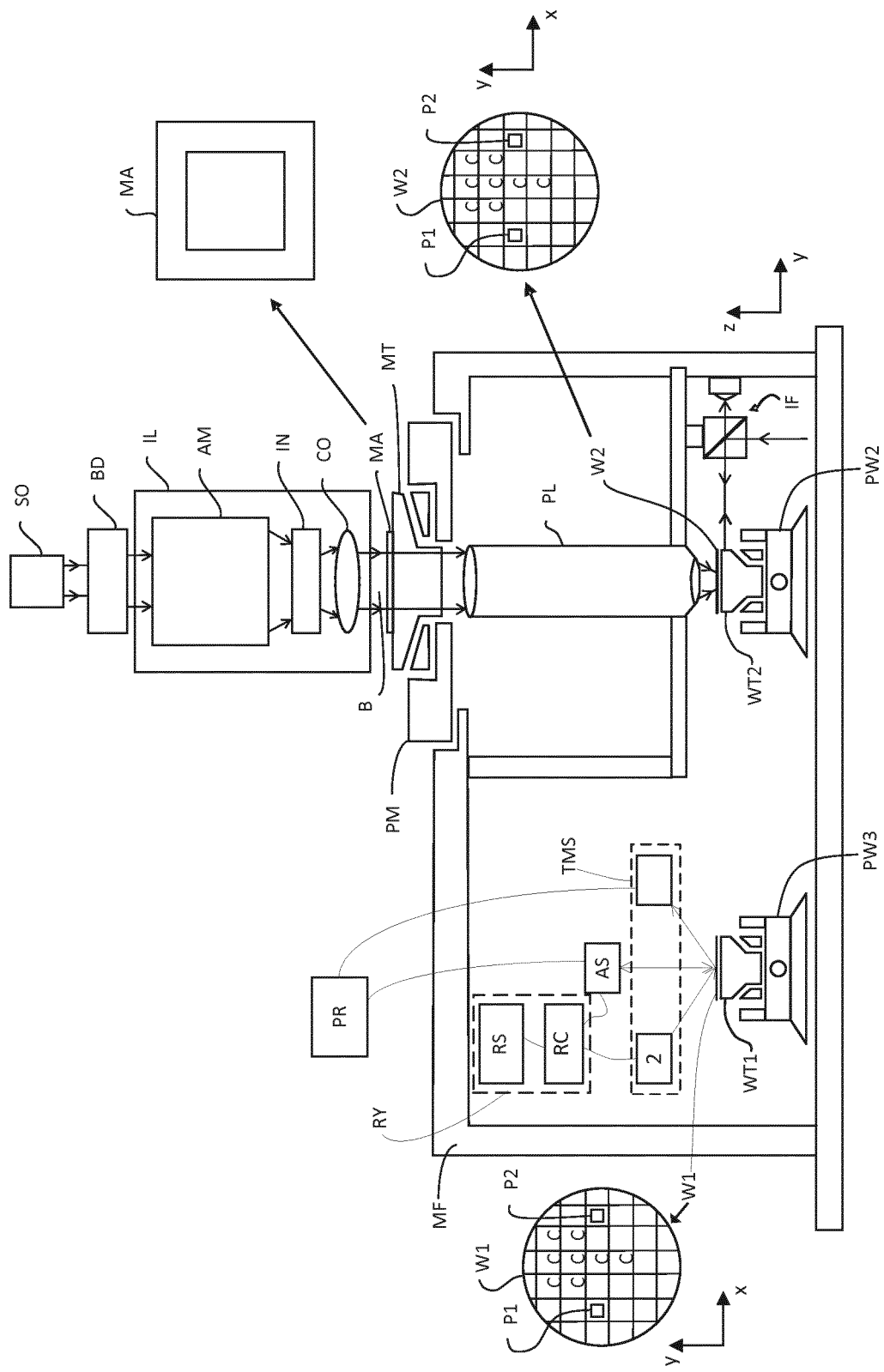
FIG. 1 depicts a schematic overview of a lithographic apparatus including a radiation system according to an embodiment of the invention.

FIG. 1 schematically depicts a lithographic apparatus LA comprising a radiation system RY according to an embodiment of the invention. The radiation system RY comprises a radiation source RS and radiation conditioning apparatus RC. The radiation system RY is configured to provide radiation, which may be referred to as measurement radiation, to an alignment system AS and to a topography measurement system TMS.

The lithographic apparatus LA includes an illumination system (also referred to as illuminator) IL configured to condition an exposure radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT2 constructed to hold a substrate (e.g., a resist coated wafer) W2 and connected to a second positioner PW2 configured to accurately position the substrate support in accordance with certain parameters, another substrate support (e.g., a wafer table) WT1 constructed to hold a substrate (e.g., a resist coated wafer) W1 and connected to a third positioner PW3 configured to accurately position the substrate support with respect to the alignment systems AS and the topography measurement system TMS, and a projection system (e.g., a refractive projection lens system) PS configured to project a pattern imparted to the exposure radiation beam B by patterning device MA onto a target portion C (e.g., comprising one or more dies) of the substrate W2.

As here depicted, the apparatus is of a transmissive type (e.g. employing a transmissive mask). Alternatively, the apparatus may be of a reflective type (e.g. employing a programmable mirror array of a type as referred to above).

In operation, the illumination system IL receives an exposure radiation beam from a radiation source SO, for example, via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the exposure radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

In operation, the exposure radiation beam B is incident on the patterning device, for example a mask, MA which is held on the mask support MT, and is patterned by the pattern (design layout) present on patterning device MA. Having traversed the mask MA, the exposure radiation beam B passes through the projection system PS, which focuses the exposure beam onto a target portion C of the substrate W. With the aid of the second positioner PW2 and a position measurement system IF, the substrate support WT2 can be moved accurately, e.g., so as to position different target portions C in the path of the exposure radiation beam B at a focused and aligned position. Similarly, the first positioner PM and possibly another position sensor (which is not explicitly depicted in FIG. 1) may be used to accurately position the patterning device MA with respect to the path of the exposure radiation beam B. Patterning device MA and substrate W may be aligned using mask alignment marks (not depicted) and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

As depicted, the lithographic apparatus may be of a type having two (dual stage) or more substrate tables WT1, WT2. In a dual stage lithographic apparatus two substrate tables WT1, WT2 are provided in order to allow properties of one substrate W1 to be measured whilst exposure of another substrate W2 is taking place ("exposure of a substrate" means projection of patterned exposure radiation onto the substrate as described above).

In the dual stage lithographic apparatus depicted in FIG. 1 the alignment system AS is provided on the left-hand side of the figure. The topography measurement system TMS is also provided on the left-hand side of the figure. The projection system PL is provided on the right-hand side of the figure. The alignment system AS measures the positions of alignment marks provided on a substrate W1 (schematically depicted by boxes P1, P2) which is held on a first substrate table WT1. The topography measurement system TMS measures the topography of the substrate W1. A pattern is simultaneously projected by the projection system PL onto a substrate W2 held on a second substrate table WT2. When measurement of the substrate W1 supported by the first substrate table WT1 is completed and exposure of the substrate W2 supported by the second substrate table WT2 is completed, the positions of the substrate tables are swapped over. The substrate W1 supported by the first substrate table WT1 is then exposed using patterned exposure radiation projected by the projection system PL. The already exposed wafer W2 supported by the second substrate table WT2 is removed from the substrate table for subsequent processing. Another substrate is then placed on the second substrate table WT2 for measurement by the alignment system AS and the topography measurement system TMS prior to exposure using patterned exposure radiation projected by the projection system PL.

An interferometer (not depicted) and/or other position measurement means may be used to monitor the position of the substrate table WT1 during alignment and topography measurements. A processor PR may receive data from the alignment system AS, the topography measurement system TMS and also receive substrate table WT1 position information. Since the substrate W is fixed on the substrate table WT1, position information relating to the substrate table may be taken as being position information relating to the substrate.

Figure 2:
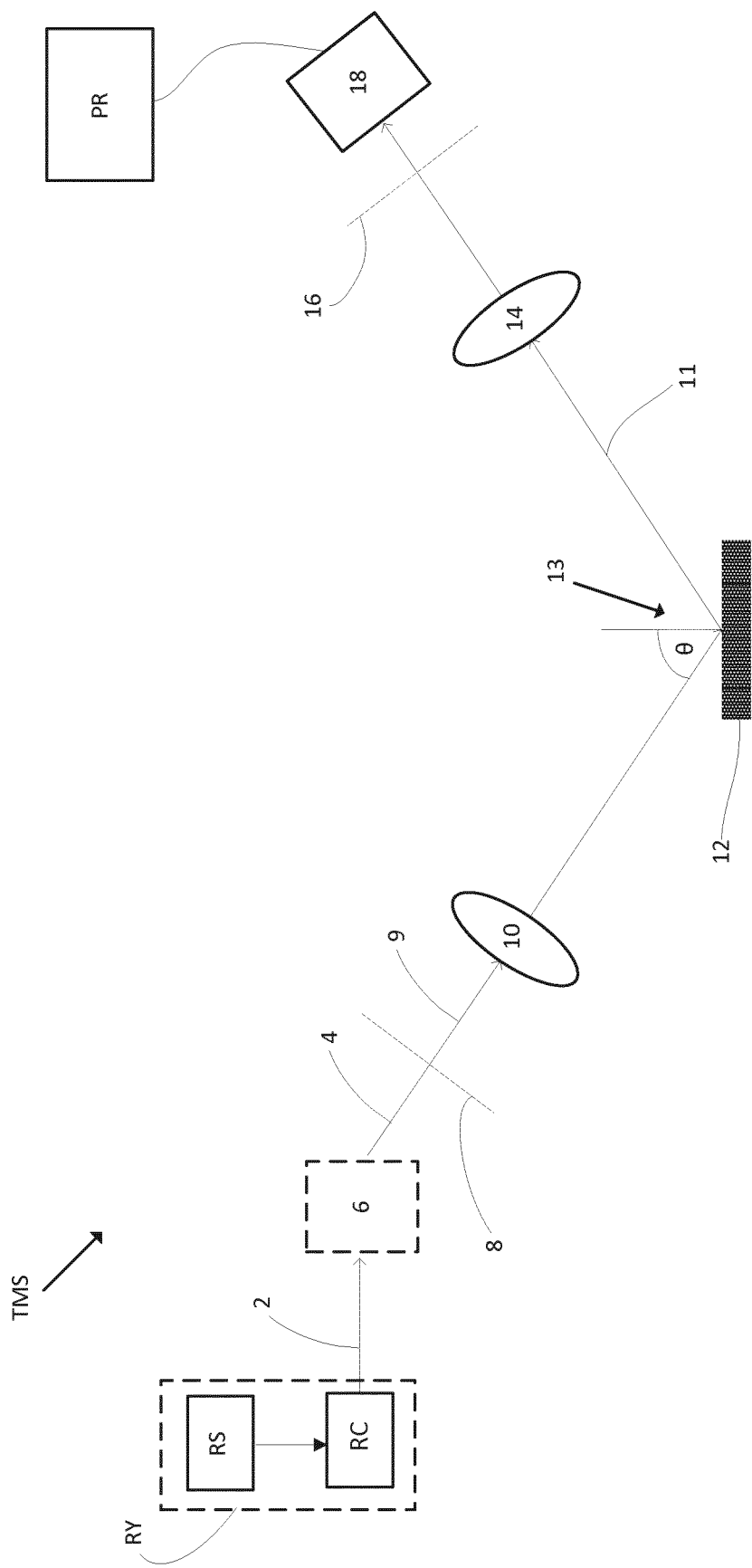
FIG. 2 schematically depicts a topography measurement system and a radiation system according to an embodiment of the invention.

FIG. 2 is a schematic diagram of the topography measurement system TMS. Measurement radiation (referred to here as radiation for brevity), used by the topography measurement system TMS is provided by the radiation system RY. During topography measurement, a radiation source RS of the radiation system RY generates a radiation beam. The radiation beam passes to a radiation conditioning apparatus RC. The radiation conditioning apparatus RC conditions the radiation to a form suitable for the topography measurement system (as described further below). Conditioned radiation 2 is output from the radiation conditioning apparatus RC and passes to optics 6 of the topography measurement system. Optics 6 may direct and/or focus the conditioned radiation to form a radiation beam 4. The radiation beam 4 is incident on a grating 8. The radiation beam 4 is patterned with an image of the grating 8 on passing through the grating. The patterned radiation beam may be referred to as a measurement beam 9 (or equivalently a measurement radiation beam).

The measurement beam 9 passes through optics 10 that are configured to form an image of the grating 8 on a target location on a substrate 12. The measurement beam 9 is incident upon the substrate at an angle of incidence θ. The grating image is formed at the location indicated by arrow 13. The measurement beam 9 is reflected from the substrate and passes through detection optics 14. The detection optics 14 are configured to receive the reflected measurement beam 11 and form an image of the grating image 13. This image of the grating image is formed at a second grating 16. A detector 18 is configured to receive radiation transmitted through the second grating 16. The detector 18 detects the intensity of radiation incident upon it and produces an output signal that is indicative of the intensity of the radiation. The detector 18 may for example be a photodiode. The detector 18 may for example be a CCD or a CMOS array whereby the detected radiation intensity is integrated across all pixels. In general, any detector that provides an output signal indicative of the intensity of radiation incident upon the detector may be used.

As the substrate 12 is scanned underneath the grating image 13, changes in the height of the substrate result in the image of the grating image 13 moving up and down at the second grating 16. This shift in position of the image of the grating image 13 causes the amount of radiation transmitted by the second grating 16 to change. A change in the amount of radiation transmitted by the second grating 16 in turn changes the intensity of radiation incident upon the detector 18. Thus, the signal output from the detector 18 is indicative of the height of the substrate 12. The signal output from the detector 18 may be analyzed by a processor PR to generate a map of the topography of the substrate 12.

The gratings 8, 16 may comprise one dimensional grating structures. The gratings may comprise two dimensional grating structures such as, for example, a checkerboard pattern. In general, any grating structure may be used. However, only spatial resolution in one dimension is required as the shift in the position of the image of the grating image that results from the changing substrate height only occurs in one dimension.

In an alternative arrangement the second grating 16 is a splitter and is configured to split the reflected measurement beam into two beams which are incident upon different detectors. A comparison is then performed between the outputs from the detectors in order to determine the height of the substrate.

In some arrangements multiple gratings may be provided upstream of the substrate 12 instead of a single grating 8. Similarly, multiple gratings may be provided downstream of the substrate 12 instead of a single grating 16. This the height of multiple points on the substrate to be measured simultaneously. In this arrangement the same optics may be used for all of the multiple measurement points. Measuring multiple points allows the substrate to be scanned in fewer strokes, and this allows the substrate's topography to be determined with greater speed.

In some arrangements, the radiation conditioning apparatus RC may provide multiple conditioned radiation beams 2, which may then pass through multiple illumination optics and illuminate multiple target locations on the substrate 12. Using multiple conditioned radiation beams may allow the substrate to be scanned in even fewer strokes, and this may allow the substrate's topography to be determined with even greater speed.

Figure 3:
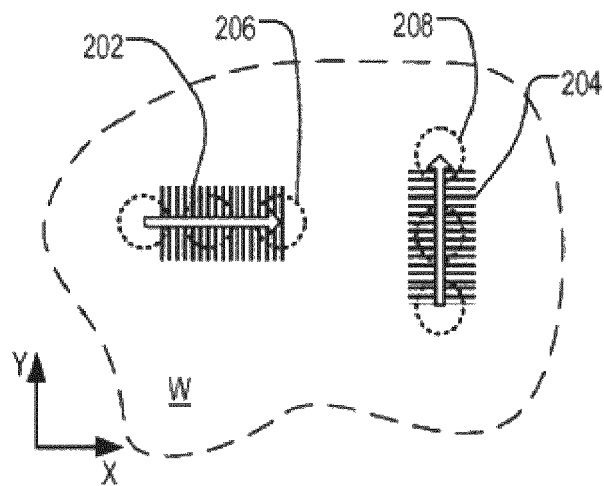
FIG. 3 schematically depicts alignment marks which may be used by an embodiment of the invention.

FIG. 3 shows examples of alignment marks 202, 204, provided on substrate W for the measurement of X-position and Y-position, respectively. Each alignment mark in this example comprises a series of bars formed in a product layer or other layer applied to or etched into the substrate. The bars are regularly spaced and act as grating lines so that the alignment mark may be regarded as a diffraction grating with a sufficiently well-known spatial period (pitch). The bars on the X-direction alignment mark 202 are parallel to the Y-axis to provide periodicity in the X direction, while the bars of the Y-direction alignment mark 204 are parallel to the X-axis to provide periodicity in the Y direction. The alignment system AS (shown in FIG. 1) scans each alignment mark optically with a spot 206 (X direction), 208 (Y direction) of radiation, to obtain a periodically-varying signal, such as a sine wave. The phase of this signal is analyzed, to measure the position of the alignment mark, and hence of substrate W, relative to the alignment system, which in turn is fixed relative a frame MF of the lithographic apparatus. The scanning movement is indicated schematically by a broad arrow, with progressive positions of the spot 206 or 208 indicated in dotted outline. The pitch of the bars (grating lines) in the alignment pattern is typically much greater than the pitch of product features to be formed on the substrate, and the alignment system AS uses a wavelength of radiation (or usually plural wavelengths) much longer than the exposure radiation to be used for applying patterns to the substrate. Fine position information can be obtained, however, because the large number of bars allows the phase of a repeating signal to be accurately measured.

Coarse and fine marks may be provided, so that the alignment system can distinguish between different cycles of the periodic signal, as well as the exact position (phase) within a cycle. Alignment marks of different pitches may also be used for this purpose. These techniques are again well known to the person skilled in the art, and will not be detailed herein. The design and operation of such sensors is well known in the art, and each lithographic apparatus may have its own design of sensor. The alignment system AS may be generally of the form described in U.S. Pat. No. 6,961,116 which is herein incorporated by reference.

Figure 4:
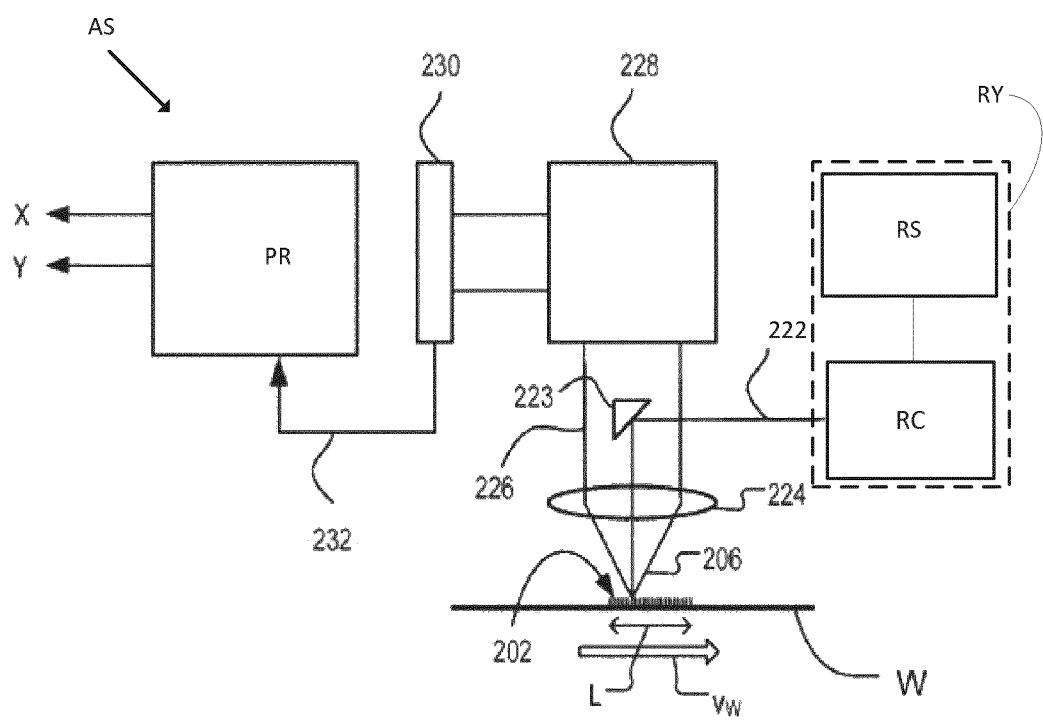
FIG. 4 schematically depicts an alignment system and a radiation system according to an embodiment of the invention.

FIG. 4 is a schematic block diagram of the alignment system AS. The radiation system RY provides radiation which is used by the alignment system AS. The radiation source RS of the radiation system RY generates a radiation beam. The radiation beam passes to the radiation conditioning apparatus RC. The radiation conditioning apparatus RC conditions the radiation to a form a conditioned beam 222 of radiation, or a plurality of conditioned beams with different wavelengths (as described further below). The conditioned beam 222 of radiation is diverted by a spot mirror 223 through an objective lens 224 onto an alignment mark, such as alignment mark 202, located on substrate W. As indicated schematically in FIG. 3, in the example of the present alignment system based on U.S. Pat. No. 6,961,116 mentioned above, the illumination spot 206 by which the alignment mark 202 is illuminated may be slightly smaller in diameter then the width of the alignment mark itself.

Radiation diffracted by the alignment mark 202 is picked up by an objective lens 224 and collimated into an information-carrying beam 226. A self-referencing interferometer 228 is of the type disclosed in U.S. Pat. No. 6,961,116 mentioned above, and processes beam 226 and outputs separate beams for different wavelengths onto a sensor array 230. The spot mirror 223 serves conveniently as a zero order stop at this point, so that the information carrying beam 226 comprises only higher order diffracted radiation from the alignment mark 202 (this is not essential to the measurement, but improves signal to noise ratios). Intensity signals 232 from individual sensors in a sensor grid 230 are provided to the processor PR. By a combination of optical processing in the block 228 and computational processing in the processor PR, values for X- and Y-position on the substrate relative to the frame MF are output.

As mentioned already, a single measurement of the type illustrated only fixes the position of the alignment mark within a certain range corresponding to one pitch of the alignment mark. Coarser measurement techniques are used in conjunction with this to identify which period of the sine wave is the one containing the marked position. The same process at coarser and/or finer levels may be performed at different wavelengths for increased accuracy and/or for robust detection of the alignment mark irrespective of the materials from which the alignment mark is made, and materials on and/or below which it sits. The wavelengths may be multiplexed and demultiplexed optically so as to be processed simultaneously, and/or they may be multiplexed by time division or frequency division. Measurement at several wavelengths may be used to provide a robust alignment system with reduced sensitivity to alignment mark asymmetry. The radiation system RY may provide radiation at several wavelengths for use by the alignment system AS.

Figure 5:
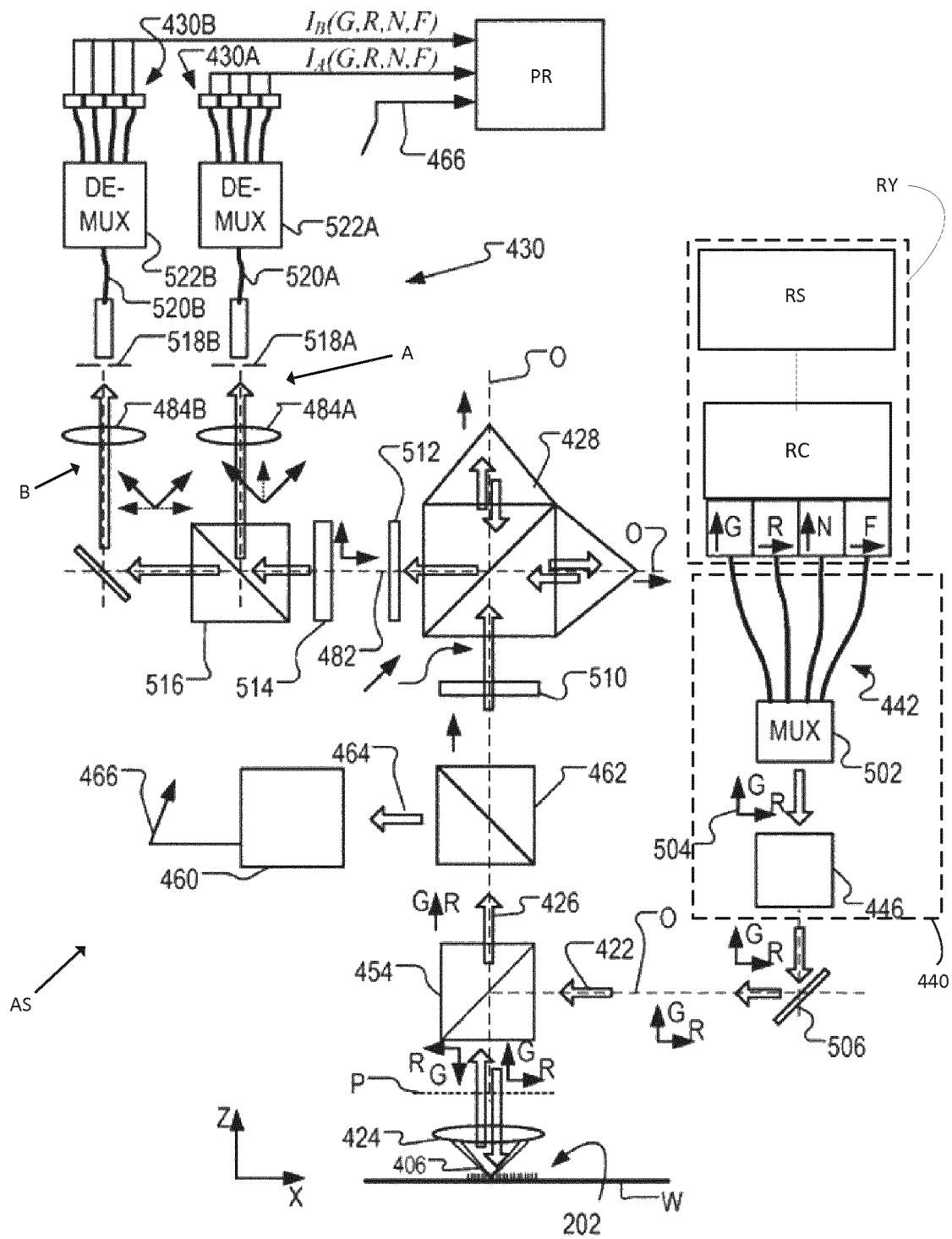
FIG. 5 schematically depicts an alternative alignment system and a radiation system according to an embodiment of the invention.

FIG. 5 illustrates an optical system of an alignment system AS that is a modified version of one described in the prior publication U.S. Pat. No. 6,961,116 mentioned above. The optical system may allow scatterometry type measurements to be performed with the alignment system, rather than with a separate scatterometer instrument.

An optical axis O which has several branches is indicated by a broken line running throughout the optical system shown in FIG. 5. For ease of comparison with the schematic diagram of FIG. 4, some parts of the optical system shown in FIG. 5 are labeled with reference signs similar to those used in FIG. 4, but with prefix "4" instead of "2". Thus, we see a conditioned radiation beam 422, an objective lens 424, an information carrying beam 426, a self-referencing interferometer 428 and a detector arrangement 430. Signals from the detector arrangement are processed by processor PR, which is modified so as to implement the novel features described below and to output an (improved) position measurement for each alignment mark.

The radiation conditioning apparatus RC outputs conditioned radiation at four different wavelengths. These wavelengths may be green G, red R, near infrared N and far infrared F. In other embodiments conditioned radiation with different wavelengths and/or a different number of wavelengths may be provided. In the depicted embodiment the green G and near infrared radiation N have a first linear polarization and the red R and far infrared radiation F have a second orthogonal linear polarization. In other embodiments different combinations of polarizations may be used.

The conditioned radiation output from the radiation system RY is delivered by optical fibers 442 via a multiplexer 502 to illumination profiling optics 446. An input beam 422 travels via beam splitter 454 to objective lens 424 having a pupil plane P. Objective lens 424 forms a spot 406 on alignment mark 202 on the wafer W. Information-carrying beam 426, diffracted by the alignment mark, passes through beam splitter 454 to interferometer 428. Interferometer 428 splits the information carrying beam into two parts with orthogonal polarization, rotates these parts about the optical axis by 180° relative to one another, and combines them into an outgoing beam 482. The outgoing beam 482 enters a detector arrangement 430 as will be described in more detail below.

Included in the present example is an asymmetry measuring arrangement 460. Arrangement 460 receives a part 464 of the information carrying beam 426 through a second beam splitter 462 positioned in advance of the interferometer. Another patent application, US20125227061 (herein incorporated by reference), describes techniques for the measurement of asymmetry using position information obtained through the detector 430. It will be appreciated that the asymmetry measuring arrangement 460 is optional and may therefore be omitted in other embodiments.

The illumination profiling optics 446 can take various forms, some of which are disclosed in more detail in prior patent application US2015109624 which is herein incorporated by reference.

The conditioned radiation used by the alignment system AS may have transverse (spatial) coherence for the interferometer 428 to produce the desired signal. In order to provide the desired transverse (spatial) coherence, the conditioned radiation which is used by the alignment system AS (and by other alignment systems) may have an $M^2$, also known as the beam quality factor, of <1.2. The conditioned radiation may comprise a single mode beam. The conditioned radiation may comprise a Gaussian beam or a beam which is substantially Gaussian. The conditioned radiation may be temporally incoherent in order to avoid interference of doubly reflected beams within the alignment system. Temporal incoherence may for example mean that the temporal coherence is less than 0.5 mm. This may for example correspond to a bandwidth of at least 0.8 nm for a wavelength of 633 nm. An appropriate minimum bandwidth for a given wavelength may be determined using the expression $$dL \cong \frac{\lambda}{L_c},$$

where dL is the bandwidth, $\lambda$ is the wavelength and $L_c$ is the coherence length. The expression $\cong$ is intended to indicate that some variation of the value may occur depending upon how the bandwidth is defined (e.g., full width half maximum, 1/e, $1/e^2$, etc). Depending upon how the bandwidth is defined, the minimum bandwidth value may be multiplied for example by $\pi$, by $\sqrt{2}$, etc.

Aspects of the alignment system AS concerned with measurement using multiple wavelengths of radiation, and concerned with the management of polarization effects, will now be explained. The illumination subsystem 440 receives from the radiation system RY radiation of four wavelengths which may be green (labeled G), red (R), near infrared (N) and far infrared (F). For convenience in the following discussion, the radiation at these four different wavelengths will be called four colours of light, it being immaterial for present purposes whether they are in the visible or non-visible parts of the electromagnetic spectrum. The radiation is linearly polarized, with the G and N radiation being oriented the same as one another, and the R and F radiation being polarized orthogonally to the polarization of the G and N radiation.

The four colours are transported by polarization maintaining fibers 442 to a multiplexer 502, where they are combined into a single four-colour beam. The multiplexer maintains linear polarization, as indicated by arrows 504.

The arrows 504 and similar arrows throughout the diagram are labeled G and R to indicate polarization of the green and red components. The N and F components are oriented the same as the G and R components, respectively.

This combined beam goes via suitable delivery optics 506 into beam splitter 454. As already described, it then reflects from a partially- or a fully reflecting surface (e.g., a 0.5 mm diameter spot mirror), which is inside the beam splitter. The objective lens 424 focuses the beam to a narrow beam 406 which is reflected and diffracted by the grating formed by alignment mark 202 on the wafer W. Radiation is collected by objective lens 424, with for example a numerical aperture NA=0.6. This NA value allows at least ten orders of diffraction to be collected from a grating with 16 μm pitch, for each of the colours.

The reflected and diffracted radiation forming information carrying beam 426 is then transported to the self-referencing interferometer 428. In this example, as already described, the beam is split by beam splitter 462 to supply a portion 464 of the information carrying beam to the asymmetry measuring arrangement 460, when provided. Signals 466 conveying asymmetry measurement information are passed from arrangement 460 to the processor PR. Just before the interferometer, polarization is rotated by 45° by a half wave plate 510. From this point on, polarization arrows are shown for only one colour, for clarity. The interferometer, as already described above and in the U.S. Pat. No. 6,961,116, consists of a polarizing beam splitter, where half of each colour is transmitted, and half of each colour reflected. Each half is then reflected three times inside the interferometer, rotating the radiation field by +90° and −90°, giving a relative rotation of 180°. The two fields are then superimposed on top of each other and allowed to interfere. A phase compensator 512 is present to compensate for path differences of the −90° and 90° image. The polarization is then rotated 45° by another half wave plate 514. Thus, having its major axis set at 22.5° to the X or Y axis. The half wave plates 510, 514 are wavelength insensitive, so that polarizations of all four wavelengths are rotated by 45°.

A further beam splitter 516 splits the optical signal into two paths designated A and B. One path contains the sum of the two rotated fields, and the other contains the difference. Depending on the initial polarization direction, the sum ends up in Path A or Path B. So in this example the sum signals for green and near infrared signals end up in one path, red and far infrared in the other. For each colour, the corresponding difference signal ends up in the other path.

Note that this arrangement chooses to use one polarization for illumination in each colour. Measurements with two polarizations per colour could be made, by changing the polarization between readings, or by time division multiplexing within a reading. However, to maintain high throughput while benefiting from some diversity in colour and polarization, a set of different colours, each colour being linearly polarized and with one subset of the colours having one polarization direction and another subset of the colours having a different polarization direction, represents a good compromise between diversity and measurement throughput. To increase diversity without impacting throughput, one can envisage an implementation similar to the four-colour scheme presented here, but with the radiation system providing using more colours, for example eight or sixteen, with mixed polarizations.

The radiation for each path A and B is collected by a respective collector lens assembly 484A and 484B. It then goes through an aperture 518A or 518B that eliminates most of the radiation from outside the spot on the substrate. Two multimode fibers 520A and 520B transport the collected radiation of each path to respective demultiplexers 522A and 522B. The demultiplexers 522A, 522B split each path in the original four colours, so that a total of eight optical signals are delivered to detectors 430A and 430B within detector arrangement 430. In one practical embodiment, fibers are arranged between the demultiplexers and eight detector elements on a detector circuit board. The detectors in this example provide no spatial resolution, but deliver time-varying intensity signals $I_A$ and $I_B$ for each colour, as the apparatus scans the alignment mark 202 on substrate W. The signals are actually position-dependent signals, but received as time-varying signals (waveforms) synchronized with the physical scanning movement between the apparatus and the alignment mark (recall FIG. 4).

Processor PR receives the intensity waveforms from the eight detectors and processes these to provide a position measurement POS. Because there are eight signals to choose from, based on different wavelengths and incident polarizations, the apparatus can obtain usable measurements in a wide variety of situations. In this regard it should be remembered that the alignment mark 202 may be buried under a number of layers of different materials and structures. Some wavelengths will penetrate different materials and structures better than others. The processor PR conventionally processes the waveforms and provides a position measurement based on the one which is providing the strongest position signal. The remaining waveforms may be disregarded. In a simple implementation, the 'recipe' for each measurement task may specify which signal to use, based on advance knowledge of the target structure, and experimental investigations. In more advanced systems an automatic selection can be made, using "Color Dynamic" or "Smooth Color Dynamic" algorithms to identify the best signals without prior knowledge. This is described by Huijbregtse et al. in "Overlay Performance with Advanced ATHENA™ Alignment Strategies", Metrology, Inspection, and Process Control for Microlithography XVII, Daniel J. Herr, Editor, Proceedings of SPIE Vol. 5038 (2003).

Each lens 484A, 484B focuses the entire field onto each element of each detector 430A, 430B, which is an arrangement similar to the known alignment system of FIG. 4. The detectors are effectively single photodiodes and do not provide any spatial information except by the scanning motion described already. A detector having spatial resolution in a conjugate pupil plane can be added, if desired. This may, for example, allow angle-resolved scatterometry methods to be performed using the alignment system hardware.

Figure 6:
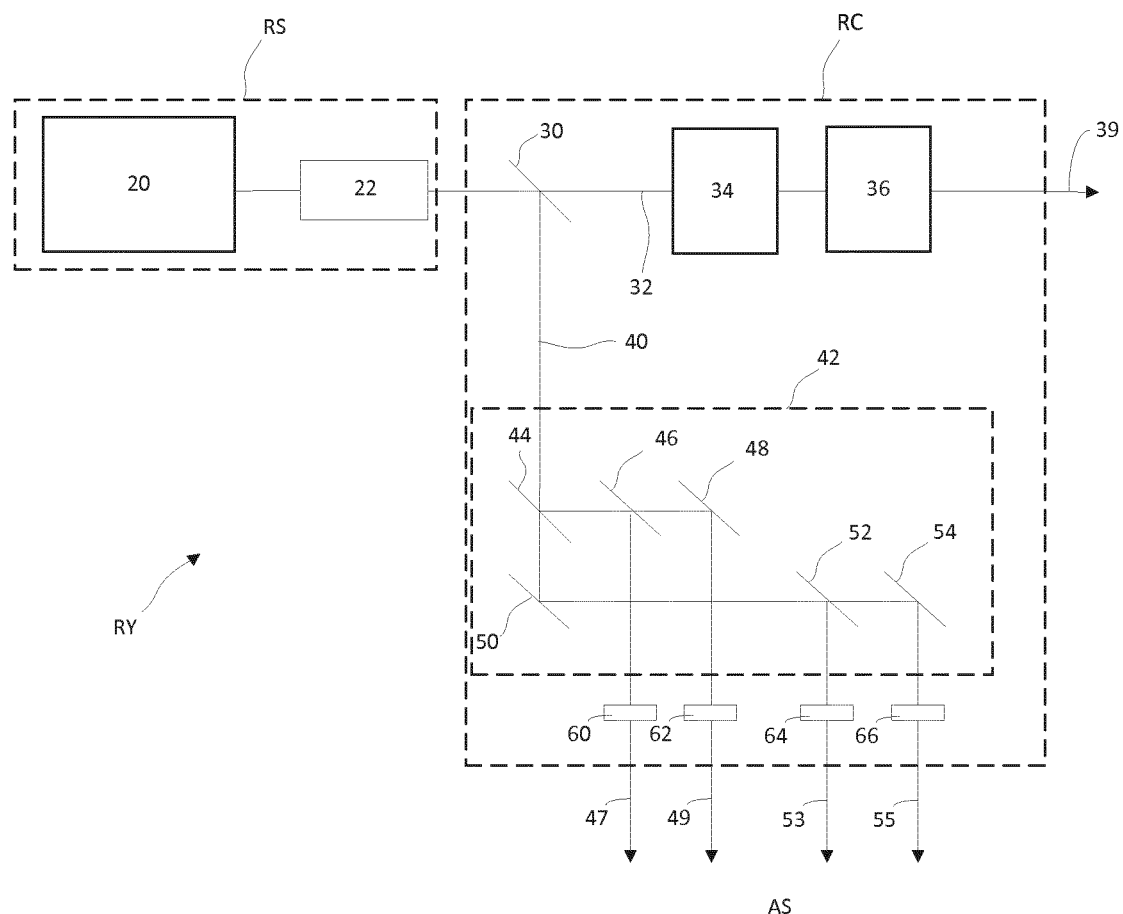
FIG. 6 schematically depicts a radiation system according to an embodiment of the invention.

FIG. 6 depicts schematically a radiation system RY according to an embodiment of the invention, comprising a radiation source RS and a radiation conditioning apparatus RC. The radiation source RS is configured to provide radiation over a range of wavelengths. For example, the radiation source RS may be configured to provide radiation in a range from ultraviolet to infrared or from visible to infrared. For example, the radiation source RS may provide radiation with a wavelength as short as 500 nm, and may provide radiation with a wavelength as short as 220 nm (or shorter). For example, the radiation source RS may provide radiation with a wavelength of up to 900 nm. The radiation source may provide radiation with a wavelength of up to 2 microns.

The radiation source RS may for example be a so called white light laser. This name may be interpreted as meaning that radiation is emitted over a range of wavelengths, and is not intended to imply that the emitted radiation is limited to visible radiation. In one example, the radiation source RS may comprise a pump laser 20 together with an optical fiber 22, the fiber being configured to convert radiation output from the pump laser to radiation spread over a range of wavelengths. This may be referred to as super continuum generation. The pump laser 20 may be configured to provide a pulsed laser beam. The laser pulses may for example be infrared, for example, around 1565 nm. The laser may for example have an output power of around 20 W. The pulses may have a duration which is less than 1 ns, for example between tens of fs and tens of ps. In an embodiment, the pump laser 20 may include a pulse compression system, which may be arranged outside of an oscillator of the laser, and which is used to reduce the duration of laser pulses output by the laser.

The laser pulses are coupled into the optical fiber 22. The optical fiber 22 acts to convert the laser pulses from a relatively narrow wavelength range to a broader wavelength range. As noted above this may be referred to as super continuum generation. In one embodiment, the optical fiber 22 may include a quartz core. In another embodiment the optical fiber 22 may include a hollow core, which may for example be filled with a noble gas. The laser pulses are confined within the optical fiber, e.g., by anti-resonant reflection, and consequently the core of the optical fiber experiences a higher intensity of radiation than other parts of the optical fiber. Because the laser pulses are short (e.g., less than 1 ns in duration), the intensity of the radiation is very high in the core of the optical fiber. Due to the high intensity of the radiation in the core of the optical fiber, nonlinear effects occur in the fiber core. These nonlinear effects act to broaden the spectrum of the radiation.

A hollow core optical fiber may use shorter laser pulses than a solid core optical fiber. For example, a hollow core optical fiber may be pumped using laser pulses with a duration of around 300 fs (for example, approximately 100 fs). For example, a solid core optical fiber may be pumped using laser pulses with a duration of around 30 ps (for example, approximately 10 ps).

A hollow core optical fiber may be preferred to a solid core optical fiber. This is because the material of the solid core, which may for example be quartz, may become damaged if the broadened spectrum of the radiation includes ultraviolet radiation. This is because ultraviolet radiation at high fluence damages quartz, turning it black. If this were to occur then the effectiveness of the fiber would be reduced and it would need to be replaced. When a hollow core fiber filled with a noble gas is used, the noble gas interacts to a much lesser extent (if at all) with the ultraviolet radiation. Damage to the noble gas is thus avoided or is less than damage to quartz in a solid core fiber. If the noble gas becomes damaged (or degraded over time) then it may be purged from the hollow core and replaced.

Radiation output by the radiation source RS may be linearly polarized (the pump laser may be linearly polarized and this polarization may be conserved). Radiation output by the radiation source RS may be in a transverse electric mode, which may be referred to as $TEM_{00}$.

Embodiments of the invention may use ultraviolet radiation in the topography measurement system TMS. This is because ultraviolet radiation will be absorbed less into material layers provided on a substrate (compared with for example infrared radiation), and will therefore provide a more accurate measurement of the surface topography of a substrate. In contrast, it may be desirable for the alignment system AS to use infrared radiation. This is because the alignment marks provided on a substrate may be buried below layers of material, and infrared radiation may be capable of penetrating through those layers such that the alignment marks are illuminated by the infrared radiation. It may also be desirable for the alignment system to use visible radiation (e.g., in addition to using infrared radiation). Thus, in some embodiments, wavelengths used by the topography measurement system TMS may be shorter than wavelengths used by the alignment system AS. In other words, in some embodiments there is no overlap between the wavelengths used by the topography measurement system TMS and the alignment system AS. In other embodiments there may be some overlap between wavelengths used by the topography measurement system TMS and the alignment system AS. For example, visible radiation wavelengths may be used by the topography measurement system. Variation of the signals output from the topography measurement system as a function of wavelength may provide information about layers of material present on the substrate.

Referring again to FIG. 6, the radiation conditioning apparatus RC converts radiation output from the radiation source RS to radiation suitable for use by a topography measurement system TMS and radiation suitable for use by an alignment system AS. A dichroic mirror 30 separates radiation emitted from the radiation source RS into two beams. The dichroic mirror 30 may be configured to reflect radiation which has a wavelength of around 390 nm or longer, i.e., visible and infrared radiation, and may be configured to transmit radiation with a wavelength less than around 390 nm, i.e., UV radiation. In other embodiments the dichroic mirror may be configured to reflect and transmit other wavelengths. Other optical elements may be used to separate the beam on the basis of wavelength. As noted elsewhere, there may be overlap between wavelengths used by the alignment system AS and wavelengths used by the topography measurement system TMS.

It may be desirable for radiation which is used by the topography measurement system to be generally uniform. This is because non-uniformity of the radiation will cause distortion of the grating image which is formed at the second grating 16 of the topography measurement system TMS. The distorted grating image will in turn introduce an error into the measured height of the substrate, for example, by shifting the centre of gravity of the grating image. The non-uniformity may consist of field non-uniformity and pupil non-uniformity. Field non-uniformity is variation of intensity across the radiation beam in field plane such as the plane of the grating 8. Pupil non-uniformity is variation of the angular distribution of radiation across the radiation beam in the field plane, or equivalently variation of intensity across the radiation beam in a pupil plane. The radiation may be made spatially incoherent and may be homogenized to provide a desired uniformity. The term spatially incoherent may be interpreted as meaning that spatial coherence is sufficiently low that it does not have a significant impact upon the accuracy of measurements performed using the topography measurement system. Non-uniformity may be measured as a percentage variation relative to a mean radiation intensity. The radiation may have a field non-uniformity of around 20% or less. The radiation may have a pupil non-uniformity of around 30% or less.

The transmitted radiation (which may be referred to as the first beam portion 32), is directed to a coherence removal apparatus 34 which is configured to remove or reduce spatial (transverse) coherence from the first beam portion 32. It may be preferable for radiation used by the topography measurement system TMS not to include speckle, because speckle may introduce errors into the topography measurements performed by the topography measurement system.

Examples of coherence removal apparatus are disclosed in U.S. Pat. No. 8,164,740 which is herein incorporated by reference.

In one example the coherence removal apparatus 34 may comprise a plurality of rods having different lengths. The rods provide different path lengths for the radiation, the differences between the path lengths being longer than a coherence length of the radiation such that temporal coherence is removed between different parts of the radiation that traveled along different paths. The radiation output from the rods may be collected by a lens. When the different parts of the beam are combined together by the lens, the different parts of the combined beam are not coherent relative to each other and add together to provide a beam which is spatially incoherent, or has spatial coherence which is sufficiently low for the topography measurement system. In another example the coherence removal apparatus may comprise a series of reflective surfaces which are spaced apart from each other and are configured to reflect different portions of the radiation. The separation between the reflective surfaces may be sufficiently large to remove coherence from radiation reflected from different reflective surfaces.

The first beam portion 32 may also pass through a homogenizer 36. The homogenizer 36 may be configured to remove or reduce spatial intensity variations across the radiation beam. The homogenizer may apply a desired profile to radiation of the first beam portion. In some embodiments, the homogenizer may form part of optics 6 of the topography measurement system TMS. In some embodiments the homogenizer and the coherence removal apparatus may be provided a single module.

Figure 7:
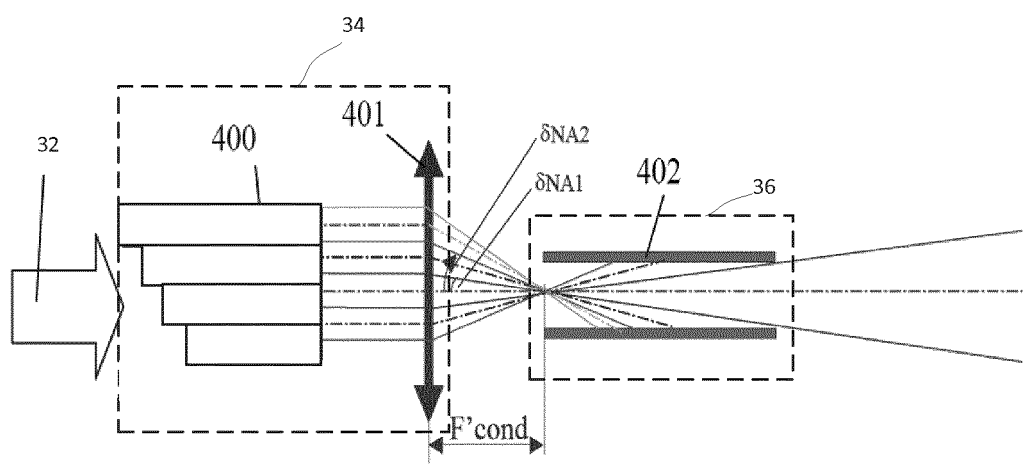
FIG. 7 schematically depicts a coherence removal apparatus and a homogenizer which may form part of the radiation system of FIG. 6.

An example of a coherence removal apparatus and a homogenizer is depicted in FIG. 7. These may be provided as a single module. The coherence removal apparatus 34 comprises a set of transmissive elements 400, for example transmissive rods, that is placed before a condensing lens 401. The homogenizer 36 comprises a quartz rod 402 with planar reflecting upper and lower surfaces. The first beam portion 32 is directed toward the set of transmissive elements 400. The set of transmissive elements 400 provide a plurality of beams of radiation which are directed toward the condensing lens 401 and then the homogenizer 36. Each element of the set of transmissive elements 400 has an optical path length that is different than that of its neighbors to remove or reduce the coherence of the radiation. For example, this difference can be greater than the temporal coherence length of the radiation provided by the source RS.

The coherence removal apparatus 34 and the homogenizer 36 both have the effect of increasing the etendue of the first beam portion 32. For, example referring to FIG. 7, if the transmissive elements 400 were not present then focal point of the beam portion 32 would be diffraction limited. With the transmissive elements 400 present, the focal points become broadened because the effective aperture is reduced by a factor of 4, i.e., 5 times broader. Thus, the etendue has increased. Referring to the quartz rod 402, the entrance of the rod is partly filled but the exit is uniformly filled. The divergence of the beam portion 32 has not changed, and thus the etendue has increased. the same. Thus overall, this module causes an etendue increase. In general, making the beam portion 32 transverse incoherent means that the etendue is increased, either by increasing the divergence (with constant field distribution), or by increasing the field distribution (with constant divergence) or both.

In order to obtain incoherent light from coherent light (FIG. 7), a multimode fiber may be used that has a length in the range of 10 to 20 meters. Light that enters the multimode fiber coherently may exit the fiber incoherently.

In general, the coherence removal apparatus 34 and the homogenizer 36 will increase the etendue of the first beam portion 32. Increasing the etendue may be desirable because the topography measurement system TMS may use a relatively large field of radiation, and it may be difficult to provide such a field of radiation with radiation which has a relatively low etendue, for example, a $TEM_{00}$ radiation beam output from the radiation source RS. Radiation with an etendue of the order of 1E-7 $m^2$ Sr or more may be used.

Once the first beam portion has passed through the coherence removal apparatus and the homogenizer, a conditioned beam of radiation 39 is output. The conditioned beam of radiation 39 is suitable for use by the topography measurement system TMS.

The portion of the radiation which is reflected by the dichroic mirror 30 may be referred to as the second beam portion 40. The second beam portion 40 may be linearly polarized. The second beam portion 40 is directed towards a wavelength selecting apparatus 42. The wavelength selecting apparatus 42 is configured to select from the second beam portion 40 a wavelength or wavelengths of radiation which will be used by the alignment system AS. As noted further above, the radiation beam, and thus the second beam portion 40, may be a single mode beam. It may be desired to use radiation with a single mode in the alignment system AS, because if more than one mode were present this could cause errors to occur in the alignment system. All parts of the second beam portion should be capable of interfering with each other. The second beam portion 40 may be a single mode $TEM_{00}$ beam. This mode has the smallest etendue and this will provide a small spot size and a small divergence. A single mode $TEM_{00}$ beam may for example be used by an alignment system of the type depicted in FIG. 4 or an alignment system of the type depicted in FIG. 5. It may be desirable to use a beam with a relatively small etendue, e.g., of the order of 1E-13 $m^2$ Sr. In general, the etendue of the radiation used by the alignment system may be orders of magnitude smaller than the etendue of the radiation used by the topography measurement system, for example, at least five orders of magnitude smaller. In the depicted embodiment the wavelength selecting apparatus 42 comprises a set of dichroic mirrors which are each configured to reflect radiation above a different wavelength and to transmit radiation below that wavelength. In the depicted example, the second beam portion 40 may consist of radiation with wavelengths in the range 390 nm to far infrared (e.g., 2000 nm). A first dichroic mirror 44 of the wavelength selecting apparatus 42 reflects all radiation with a wavelength longer than 700 nm, i.e., all infrared radiation. The reflected radiation then passes to a second dichroic mirror 46 which reflects all radiation with a wavelength of 1500 nm or more, i.e., far infrared radiation. This provides a far infrared radiation beam 47. The far infrared beam 47 is linearly polarized. Polarization of the radiation output from the radiation source RS has been preserved. A waveplate 60 may be used to rotate the polarization of the far infrared beam 47. The far infrared beam 47, which may be referred to as a conditioned radiation beam, may be input to the alignment system. If the far infrared beam 47 was not polarized then a polarizer could be used to apply a desired polarization to the far infrared beam.

Radiation which is transmitted by the second dichroic mirror 46 of the wavelength selecting apparatus consists of near infrared radiation, i.e., radiation in the range 700 to 1500 nm. That radiation, which may be reflected by a conventional (i.e., not dichroic) mirror 48, provides a near infrared radiation beam 49. A waveplate 62 may be used to rotate the polarization of the near infrared beam 49. The near infrared beam 49, which may be referred to as a conditioned radiation beam, may be input to the alignment system AS. If the near infrared beam 49 was not polarized then a polarizer could be used to apply a desired polarization to the far infrared beam.

Radiation which is transmitted by the first dichroic mirror 44 of the wavelength selecting apparatus 42 is in the visible range of wavelengths (i.e., 390 to 700 nm). A conventional (i.e., not dichroic) mirror 50 may be used to reflect this radiation. The radiation may be incident upon a third dichroic mirror 52 of the wavelength selecting apparatus 42, which is configured to reflect radiation with a wavelength longer than 570 nm. This provides radiation in the range 570 to 700 nm. This radiation is referred to here as the long wavelength visible radiation beam 53. A waveplate 64 may be used to rotate the polarization of the long wavelength visible radiation beam 53. The long wavelength visible radiation beam 53, which may be referred to as a conditioned radiation beam, may be input to the alignment system AS. If the long wavelength visible radiation beam 53 was not polarized then a polarizer could be used to apply a desired polarization to the long wavelength visible radiation beam.

Radiation which is transmitted by the third dichroic mirror 52 is in the range 390 to 570 nm and may be referred to as short wavelength visible radiation. The short wavelength visible radiation 55 may be reflected by a conventional mirror 54. This radiation is referred to here as the short wavelength visible radiation beam 55. A waveplate 66 may be used to rotate the polarization of the short wavelength visible radiation beam 55. The short wavelength visible radiation beam 55, which may be referred to as a conditioned radiation beam, may be input to the alignment system AS. If the short wavelength visible radiation beam 55 was not polarized then a polarizer could be used to apply a desired polarization to the short wavelength visible radiation beam.

Thus, the wavelength selecting apparatus 42 provides as an output four beams of radiation 47, 49, 53, 55, each of which has a different wavelength range. These beams of radiation may be $TEM_{00}$ beams. The beams of radiation may be used by the alignment system AS in the manner described further above.

The wavelength selecting apparatus 42 may be modified to provide a larger or smaller number of radiation beams with different wavelengths. This may be achieved by using more or fewer dichroic mirrors. Wavelength selecting elements other than dichroic mirrors may be used.

The wavelength selecting apparatus may be considered to be a wavelength based beam separation apparatus, because it separates an incident radiation beam into multiple beam portions. The wavelength based beam separation apparatus may separate an incident radiation beam (or beam portion) into two, three or more beam portions.

A wavelength selecting apparatus may also be used to condition the first beam portion 32 for the topography measurement system TMS. For example, different wavelengths of radiation may be used by the topography measurement system TMS in order to obtain information about layers of material present on a substrate (as mentioned further above). The wavelengths selected for use by the topography measurement system TMS may be different from those selected for use by the alignment system AS.

In the above described wavelength selecting apparatus, radiation beams with a relatively large range of wavelengths are provided to the alignment system AS. It may be desirable to obtain an alignment signal from the alignment system AS using radiation with a narrower wavelength band. Where this is the case a filter may be used which transmits radiation with a desired wavelength. For example, a filter may be used to select green radiation from the short wavelength visible radiation 55. The filter may for example be placed before a detector such as detector 430A,B of the alignment system AS depicted in FIG. 5. Another filter may be used to select red radiation from the long wavelength visible radiation 53. Again, the filter may for example be placed before a detector such as detector 430A,B of the alignment system AS depicted in FIG. 5. Other filters may be used to select a desired near infrared wavelength and a desired far infrared wavelength, for example, located before detectors.

The filters may for example select a band of wavelengths. The filters may, for example, select radiation with a bandwidth of between 5 and 20 nm (e.g., a bandwidth of around 10 nm).

In general, filters may be used to select desired wavelengths of radiation used by the alignment system AS, either before the radiation is directed towards a substrate W or after the radiation has been reflected from the substrate W. An advantage of using filters before radiation is directed onto the substrate W is that the power of radiation, which is incident upon the substrate W is reduced. This may be desirable if there is a risk that resist on a substrate W could become exposed and/or ablated by the radiation.

In an alternative arrangement (not depicted), the wavelength selecting apparatus 42 may comprise mirrors which are configured to select specific wavelengths of radiation for use by the alignment system AS. These may for example be so called multi-layer mirrors which are provided with alternating layers of material with different refractive indices. The separation between the layers of the mirrors may be selected such that each mirror reflects radiation of a particular wavelength, the remaining wavelengths being transmitted. The mirrors may for example reflect bands of wavelengths, for example radiation with a bandwidth of between 5 and 20 nm (e.g., a bandwidth of around 10 nm).

In an embodiment, the wavelengths which are provided by the radiation conditioning apparatus RC may be adjustable. Adjustability may for example be provided by using one or more acousto optic modulators to generate gratings which diffract radiation of desired wavelengths.

In the embodiment depicted in FIG. 6 radiation emitted from the radiation source RS is split such that ultraviolet wavelengths are passed to the topography measurement system TMS, and visible and infrared wavelengths are passed to the alignment system AS. In other embodiments the split between wavelengths passed to the topography measurement system TMS and the alignment system AS may be different. In some embodiments, some wavelengths of radiation may be used by both the topography measurement system TMS and the alignment system AS. For example, visible radiation wavelengths may be used by both the topography measurement system TMS and the alignment system AS.

In the embodiment depicted in FIG. 6 the radiation system RY is used to provide radiation which is used by two types of measurement system, i.e., the topography measurement system TMS and the alignment system AS. In other embodiments the radiation provided by the radiation system RY may be used by other types of measurement system (e.g., in addition to or instead of the topography measurement system TMS and/or the alignment system AS). In general, the radiation conditioning apparatus RC may be configured to separate the radiation beam into at least two beam portions and to condition the at least two beam portions differently. Conditioning of the at least two beam portions may be done before being provided to and received by at least two measurement systems. Thus, the radiation beam is split and conditioned before interaction with a target.

The measurement systems arranged to receive a portion of the at least two beam portions may be of different system types, or may be of a similar system type.

Radiation output from the radiation system RY may be used by a substrate table position measurement system which directs a beam of radiation onto a diffraction grating located on a substrate table and measures the phase of resulting diffraction fringes. The measurement may be based on the moiré detection principle, and thus may use radiation which has transverse (spatial) coherence but not temporal coherence. The radiation may for example have an infrared wavelength, for example, 780 nm (+/−50 nm). The radiation may be linearly polarized. The grating may be referred to as a grating scale.

In more detail, the position measurement system may comprise a double pass interferential grating encoder. A collimated linearly polarized beam may be delivered from the radiation system RY via a polarization maintaining single mode fiber, and directed towards a grating on the substrate table. The grating is a reflective phase grating with a groove depth of $\lambda/4$, and may suppress the 0th diffraction order while increasing the intensities of the 1st order diffracted beams. The radiation beam is diffracted by the grating into a positive and a negative diffraction angle, each of which forms an arm of the interferometer. In each arm of the interferometer radiation is diffracted by a static grating and then passes via a $\lambda/4$ plate to a porro prism. The $\lambda/4$ plates have opposite signs in each arm of the interferometer. The porro prism applies a shift to the radiation in a direction transverse to the measurement direction. The radiation travels back from the porro prism via the $\lambda/4$ plates and the static gratings to the grating on the substrate table. The cumulative effect of the $\lambda/4$ plates is to apply circular and counter-rotating polarisations to the radiation beams of the two arms of the interferometer. Radiation from the interferometer arms is recombined to receive an additional phase shift upon diffraction by the grating on the substrate table. A phase difference between the interferometer arms is now equal to $8\pi\Delta x/p$, where $\Delta x$ is the displacement of the grating on the substrate table and p is the pitch of that grating. Because the polarization states of the radiation returned from the interferometer arms are circular and counter rotating, a homodyne phase analyzer may be used to discriminate between the radiation returned from each of the interferometer arms.

Radiation output from the radiation system RY may be used by a fuel droplet metrology system of an EUV exposure radiation source, which may form part of an EUV lithographic apparatus. The EUV exposure radiation source may comprise a droplet generator configured to provide droplets of fuel such as tin, onto which pulses of laser radiation are directed. The laser radiation converts the fuel into EUV emitting plasma. The fuel droplet metrology system monitors the positions of the droplets, allowing adjustments to be made to the laser radiation beam and/or to the droplet generator to ensure that the laser radiation is incident upon the fuel droplets. The fuel droplet metrology system illuminates an area through which the droplets travel and uses a camera to capture images of the droplet. The radiation system RY may provide radiation which is used to illuminate one or more areas through which the droplets travel. The radiation may be provided as one or more curtains of radiation through which fuel droplets pass. It may be desirable for the curtain(s) of radiation to be uniform. Consequently, radiation which is used to form the curtain(s) of radiation may be conditioned using a coherence removal apparatus and a homogenizer. Different curtains of radiation may be provided. These may have the same wavelengths or may have different wavelengths. The radiation may for example comprise one or more infrared wavelength(s). Example wavelengths are 800 nm (+/−50 nm) and 1150 nm (+/−50 nm). A cone of radiation which illuminates the fuel droplets may also be provided. Again, the radiation may be conditioned using a coherence removal apparatus and a homogenizer. The cone of radiation may for example have an infrared wavelength. An example wavelength is 900 nm (+/−50 nm).

Radiation output from the radiation system RY may be used by a reticle inspection system. The reticle inspection system may form part of the lithographic apparatus. The reticle inspection system may comprise a scanning laser system which scans a laser beam over the surface of the reticle, together with a detector which detects radiation reflected from the reticle. Detection may be based on dark field illumination. The radiation beam which is used by the reticle inspection system may be a single mode beam (e.g., $TEM_{00}$). The radiation beam may for example have an infrared wavelength (for example, 800 nm+/−50 nm). The reticle inspection system may be designed for use with continuous wave (CW) radiation rather than pulsed radiation. As noted elsewhere, the radiation output from the radiation system RY may be pulsed. However, this will not adversely affect use of the reticle inspection system provided that the acquisition time of the detector of the reticle inspection system is longer than a separation between radiation pulses output from the radiation system RY. For example, a pulse repetition rate of radiation output from the radiation system RY may be three or more times faster than a response frequency of the detector.

Embodiments of the invention have been described in the context of a lithographic apparatus with transmissive optics. However, other embodiments may form part of a lithographic apparatus with reflective optics.

In FIG. 1, the radiation system RY is depicted as being located inside the lithographic apparatus LA. The lithographic apparatus may comprise a controlled environment such as a vacuum, for example, if the lithographic apparatus is an EUV lithographic apparatus. Where this is the case, either or both of the radiation source RS and radiation conditioning apparatus RC of the radiation system RY may be located outside of the controlled environment, with radiation being coupled to measurement systems inside the controlled environment (e.g., via optical fibers). In general, the radiation system RY may be provided at any desired location, and radiation may be coupled from the radiation system to measurement systems (e.g., via optical fibers).

In an embodiment, the radiation system RY may provide radiation which is used simultaneously by both the alignment system AS and the topography measurement system TMS.

In an embodiment, the radiation system RY may provide radiation, which is used simultaneously by more than one type of measurement system. For example, two or more types of measurement systems use the same radiation system RY. The radiation source RS may provide radiation which is used, for example simultaneously, by two or more of: an alignment system AS, a topography measurement system TMS, a position measurement system, a fuel droplet metrology system, a reticle inspection system.

In the embodiment illustrated in FIG. 6, the radiation beam output from the radiation source RS is separated into two beam portions 32, 40 by a dichroic mirror 30. The dichroic mirror is an example of a wavelength based beam separation apparatus.

In other embodiments, a beam separating apparatus may be a reflector configured to intersect with part of the radiation beam, such that that part is reflected by the reflector but a remaining part of the radiation beam is not. More than one such partially intersecting reflector may be used in order to generate more than two radiation beam portions. A beam expander may be used to increase a cross-sectional size of the radiation beam upstream of the reflector. A focusing lens may be located upstream of the partially intersecting reflector, with the partially intersecting reflector at a focal point of the lens. When such an arrangement is used, the part of the radiation beam which is reflected by the partially intersecting reflector may be determined by an angular distribution of the radiation beam upstream of the partially intersecting reflector.

In other embodiments the beam separating apparatus may be configured to periodically intersect with and reflect part of the radiation beam or a radiation beam portion. For example, a rotating reflective disk with radially distributed openings may be used, analogous to a so called chopper which may be used to periodically interrupt a radiation beam.

In other embodiments the beam separating apparatus may comprise a polarizing beam splitter which is configured to reflect part of the radiation beam having a first polarization, and is configured to transmit part of the radiation beam having a second polarization.

In other embodiments, the beam separating apparatus may comprise an electro-optic element which is configured to separate the radiation beam or a radiation beam portion into at least two parts. The electro-optic apparatus may for example be a Pockels cell or an acousto-optic tunable filter.

The above examples of the beam separating apparatus are described in the context of separating the radiation beam. However, they may alternatively (or additionally) be used to separate a radiation beam portion.

The beam separating apparatus described above are each described singularly. However, a plurality of beam separating apparatus may be provided, for example in order to form more than two radiation beam portions.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (RCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). For example, embodiments of the invention may form part of a metrology apparatus which is used to measure properties of a substrate onto which a pattern has been projected by a lithographic apparatus. The metrology apparatus may include an alignment system and may include a topography measurement system TMS. The metrology apparatus may include other systems mentioned above such as position sensing interferometers. In an embodiment, the metrology system may include a scatterometry system (which may be referred to as Yieldstar™). The scatterometry system may be configured to measure radiation intensity imbalance between first diffraction orders formed by two gratings which are located on top of each other (e.g., provided in different material layers on a substrate). The imbalance indicates relative alignment between the gratings. The scatterometry system may perform multiple measurements at the same position using radiation having different wavelengths (e.g., simultaneously). The scatterometry system may perform multiple measurements at different positions simultaneously. Radiation used by the scatterometry system may be polarized. Radiation used by the scatterometry system may have one or more wavelengths in the range 400 to 900 nm. The radiation may have a coherence length of less than 0.5 mm. The radiation may have an etendue of the order of 1E-9 $m^2$ Sr or more. The radiation may have been conditioned by the coherence removal apparatus and the homogenizer.

The mask inspection apparatus, metrology apparatus, and other measurement or processing apparatus may be generally referred to as lithographic tools. Such a lithographic tool may use vacuum conditions or ambient (non-vacuum) conditions.

The present invention may also be described by the following clauses:

1. A radiation system comprising a radiation source and a radiation conditioning apparatus, wherein the radiation source is configured to provide a radiation beam with wavelengths which extend from ultraviolet to infrared, and wherein the radiation conditioning apparatus is configured to separate the radiation beam into at least two beam portions and is further configured to condition the at least two beam portions differently before being received by at least two measurement systems.

2. The radiation system of clause 1, wherein the radiation conditioning apparatus is configured to condition a first beam portion to provide conditioned radiation for use by a first type of measurement system, and to condition a second beam portion to provide conditioned radiation for use by a second type of measurement system.

3. The radiation system of clause 1 or clause 2, wherein radiation conditioning apparatus comprises a coherence removal apparatus configured to remove or reduce coherence from one or more of the beam portions.

4. The radiation system of any preceding clause, wherein the radiation conditioning apparatus is configured to increase etendue of one or more of the beam portions.

5. The radiation system of any preceding clause, wherein the radiation conditioning apparatus comprises a homogenizer configured to reduce non-uniformity of one or more of the beam portions.

6. The radiation system of any preceding clause, wherein the radiation conditioning apparatus comprises a wavelength based beam separation apparatus configured to separate the radiation beam or a radiation beam portion into at least two beam portions based upon wavelength.

7. The radiation system of clause 6, wherein the wavelength based beam separation apparatus is configured to provide three or more beam portions with different wavelengths.

8. The radiation system of clause 6 or clause 7, wherein the wavelength based beam separation apparatus comprises at least one dichroic mirror.

9. The radiation system of any preceding clause, wherein the radiation conditioning apparatus comprises a beam separating apparatus which is configured to intersect with part of the radiation beam or part of a radiation beam portion, such that that part is reflected by the beam separating apparatus but a remaining part of the radiation beam or radiation beam portion is not.

10. The radiation system of any preceding clause, wherein the radiation conditioning apparatus comprises a beam separating apparatus which is configured to periodically intersect with and reflect part of the radiation beam or a radiation beam portion.

11. The radiation system of any preceding clause, wherein the radiation conditioning apparatus comprises a polarizing beam splitter which is configured to reflect part of the radiation beam or a radiation beam portion having a first polarization, and is configured to transmit part of the radiation beam or a radiation beam portion having a second polarization.

12. The radiation system of any preceding clause, wherein the radiation conditioning apparatus comprises an electro-optic element which is configured to separate the radiation beam or a radiation beam portion into at least two parts.

13. The radiation system of any preceding clause, wherein the radiation conditioning system further comprises a plurality of waveplates configured to allow polarizations of the at least two beam portions to be rotated.

14. The radiation system of clause 2, wherein the first type of measurement system comprises a topography measurement system, or a fuel droplet metrology system.

15. The radiation system of clause 2, wherein the second type of measurement system comprises an alignment system, or a position measurement system, or a metrology system, or a reticle inspection system.

16. A lithographic apparatus configured to transfer a pattern from a patterning device to a substrate, wherein the lithographic apparatus comprises a first type of measurement system and a second type of measurement system, and wherein the lithographic apparatus further comprises a radiation system comprising a radiation source and a radiation conditioning apparatus, wherein the radiation source is configured to provide a radiation beam with wavelengths which extend from ultraviolet to infrared, and wherein the radiation conditioning apparatus is configured to:
  separate the radiation beam into a first beam portion and a second beam portion;
  condition the first beam portion to provide conditioned radiation which is provided to the first type of measurement system; and
  condition the second beam portion to provide conditioned radiation which is provided to the second type of measurement system.

17. A lithographic tool configured to measure properties of a substrate, wherein the lithographic tool comprises a first type of measurement system and a second type of measurement system, and wherein the lithographic tool further comprises a radiation system comprising a radiation source and a radiation conditioning apparatus, wherein the radiation source is configured to provide a radiation beam with wavelengths which extend from ultraviolet to infrared, and wherein the radiation conditioning apparatus is configured to:
  separate the radiation beam into a first beam portion and a second beam portion;
  condition the first beam portion to provide conditioned radiation which is provided to the first type of measurement system; and
  condition the second beam portion to provide conditioned radiation which is provided to the second type of measurement system.

18. A method comprising:
  providing a radiation beam with wavelengths which extend from ultraviolet to infrared separating the radiation beam into at least two beam portions; and
  conditioning the at least two beam portions differently.

19. The method of clause 18, wherein a first beam portion is conditioned for use by a first type of measurement system, and a second beam portion is conditioned for use by a second type of measurement system.

20. The method of clause 18 or clause 19, wherein conditioning of a beam portion comprises at least one of removing or reducing coherence, increasing etendue, reducing non-uniformity, wavelength-dependent selection.

Although specific reference may have been made above to the use of embodiments of the invention in the context of optical lithography, it will be appreciated that the invention, where the context allows, is not limited to optical lithography and may be used in other applications, for example imprint lithography and or adaptive manufacturing.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A radiation system comprising:
  a radiation source; and
  a radiation conditioning apparatus,
  wherein the radiation source is configured to provide a radiation beam with wavelengths that extend from ultraviolet to infrared,
  wherein the radiation conditioning apparatus is configured to separate by wavelength the radiation beam into at least two beam portions and is further configured to condition the at least two beam portions differently before being received by at least two different measurement systems,
  wherein the different conditioning of the at least two beam portions is based on a characteristic other than wavelength and is performed before interaction with a target,
  wherein the radiation conditioning apparatus is configured to condition a first beam portion to provide conditioned radiation for use by a first type of measurement system and to condition a second beam portion to provide conditioned radiation for use by a second type of measurement system,
  wherein the first type of measurement system comprises a topography measurement system or a fuel droplet metrology system, and wherein the second type of measurement system comprises an alignment system, a position measurement system, or a reticle inspection system.

2. The radiation system of claim 1, wherein the radiation conditioning comprises a coherence adjustment to remove or reduce coherence from one or more of the beam portions.

3. The radiation system of claim 1, wherein the radiation conditioning comprises increasing etendue of one or more of the beam portions.

4. The radiation system of claim 1, wherein the radiation conditioning comprises reducing non-uniformity of one or more of the beam portions.

5. The radiation system of claim 1, wherein the radiation conditioning apparatus is configured to provide three or more of the at least two beam portions with different wavelengths.

6. The radiation system of claim 1, wherein the radiation conditioning apparatus comprises at least one dichroic mirror for wavelength separation.

7. The radiation system of claim 1, wherein the radiation conditioning apparatus comprises a beam separating apparatus which is configured to intersect with part of the radiation beam or part of a radiation beam portion, such that that part is reflected by the beam separating apparatus but a remaining part of the radiation beam or radiation beam portion is not.

8. The radiation system of claim 1, wherein the radiation conditioning apparatus comprises a beam separating apparatus which is configured to periodically intersect with and reflect part of the radiation beam or a radiation beam portion.

9. The radiation system of claim 1, wherein the radiation conditioning apparatus comprises a polarizing beam splitter which is configured to reflect part of the radiation beam or a radiation beam portion having a first polarization, and is configured to transmit part of the radiation beam or a radiation beam portion having a second polarization.

10. The radiation system of claim 1, wherein the radiation conditioning apparatus comprises an electro-optic element which is configured to separate the radiation beam or a radiation beam portion into the at least two parts.

11. The radiation system of claim 1, wherein the radiation conditioning system further comprises a plurality of waveplates configured to allow polarizations of the at least two beam portions to be rotated.

12. A lithographic apparatus comprising:
a first type of measurement system;
a second type of measurement system; and
a radiation system comprising:
 a radiation source, and
 a radiation conditioning apparatus,
 wherein the radiation source is configured to provide a radiation beam with wavelengths which extend from ultraviolet to infrared, and
 wherein the radiation conditioning apparatus is configured to:
  separate the radiation beam by wavelength into a first beam portion and a second beam portion;
  condition the first beam portion to provide conditioned radiation, which is provided to the first type of measurement system; and
  condition the second beam portion to provide conditioned radiation, which is provided to the second type of measurement system,
 wherein the first beam portion and the second beam portion are conditioned differently based on a characteristic other than wavelength and the conditioning is performed before interaction with a target,
 wherein the radiation conditioning apparatus is configured to condition a first beam portion to provide conditioned radiation for use by a first type of measurement system and to condition a second beam portion to provide conditioned radiation for use by a second type of measurement system,
 wherein the first type of measurement system comprises a topography measurement system or a fuel droplet metrology system, and
 wherein the second type of measurement system comprises an alignment system, a position measurement system, or a reticle inspection system.

13. A lithographic tool comprising:
a first type of measurement system;
a second type of measurement system; and
a radiation system comprising:
 a radiation source, and
 a radiation conditioning apparatus,
 wherein the radiation source is configured to provide a radiation beam with wavelengths which extend from ultraviolet to infrared, and
 wherein the radiation conditioning apparatus is configured to:
  separate the radiation beam by wavelength into a first beam portion and a second beam portion;
  condition the first beam portion to provide conditioned radiation, which is provided to the first type of measurement system; and
  condition the second beam portion to provide conditioned radiation, which is provided to the second type of measurement system,
 wherein the first beam portion and the second beam portion are conditioned differently based on a characteristic other than wavelength and the conditioning is performed before interaction with a target,
 wherein the radiation conditioning apparatus is configured to condition a first beam portion to provide conditioned radiation for use by a first type of measurement system and to condition a second beam portion to provide conditioned radiation for use by a second type of measurement system,
 wherein the first type of measurement system comprises a topography measurement system or a fuel droplet metrology system, and
 wherein the second type of measurement system comprises an alignment system, a position measurement system, or a reticle inspection system.

14. A method comprising:
providing a radiation beam with wavelengths that extend from ultraviolet to infrared;
separating the radiation beam by wavelength into at least two beam portions; and
conditioning the at least two beam portions differently based on a characteristic other than wavelength and the conditioning is performed before interaction with a target,
wherein the conditioning comprises conditioning a first beam portion to provide conditioned radiation for use by a first type of measurement system and conditioning a second beam portion to provide conditioned radiation for use by a second type of measurement system, wherein the first type of measurement system comprises a topography measurement system or a fuel droplet metrology system, and wherein the second type of measurement system comprises an alignment system, a position measurement system, or a reticle inspection system.

15. The method of claim 14, wherein the conditioning comprises at least one of removing or reducing coherence, increasing etendue, reducing non-uniformity, or wavelength-dependent selection.

* * * * *